(12) United States Patent
Langstraat et al.

(10) Patent No.: US 11,493,643 B2
(45) Date of Patent: Nov. 8, 2022

(54) VEHICLE NAVIGATION SYSTEM

(71) Applicant: Westinghouse Air Brake Technologies Corporation, Wilmerding, PA (US)

(72) Inventors: Brian James Langstraat, Cedar Rapids, IA (US); Craig Willard Vandeventer, Cedar Rapids, IA (US); Frank J. Swiderski, Cedar Rapids, IA (US); Keith Edward Smith, Cedar Rapids, IA (US)

(73) Assignee: Westinghouse Air Brake Technologies Corporation, Pittsburgh, PA (US)

( * ) Notice: Subject to any disclaimer, the term of this patent is extended or adjusted under 35 U.S.C. 154(b) by 291 days.

(21) Appl. No.: 16/870,140

(22) Filed: May 8, 2020

(65) Prior Publication Data

US 2020/0264316 A1    Aug. 20, 2020

Related U.S. Application Data

(63) Continuation-in-part of application No. PCT/US2018/059787, filed on May 16, 2019.

(60) Provisional application No. 62/583,623, filed on Nov. 9, 2017.

(51) Int. Cl.
| | |
|---|---|
| *G01S 19/42* | (2010.01) |
| *G01C 21/36* | (2006.01) |
| *G01R 33/028* | (2006.01) |
| *G01C 17/38* | (2006.01) |
| *G01C 21/00* | (2006.01) |
| *G01C 25/00* | (2006.01) |
| *G01R 33/02* | (2006.01) |

(52) U.S. Cl.
CPC .............. *G01S 19/42* (2013.01); *G01C 21/36* (2013.01)

(58) Field of Classification Search
USPC ........................................................ 701/468
See application file for complete search history.

(56) References Cited

U.S. PATENT DOCUMENTS

| | | |
|---|---|---|
| 8,452,467 B2 | 5/2013 | Kumar |
| 8,521,428 B1 | 8/2013 | Liccardo et al. |
| 8,538,609 B2 | 9/2013 | Kumar |
| 8,798,902 B2 | 8/2014 | Kumar et al. |
| 9,862,396 B2 | 1/2018 | Nandedkar et al. |

(Continued)

OTHER PUBLICATIONS

Suprem et al. "Orientation and Displacement Detection for Smartphone Device Based IMUs." IEEE. Mar. 2017.

(Continued)

*Primary Examiner* — Tyler D Paige
(74) *Attorney, Agent, or Firm* — The Small Patent Law Group LLC; Philip S. Hof

(57) ABSTRACT

A vehicle navigation system includes an external source sensor onboard a vehicle system that determines headings of the vehicle system. The external source sensor determines the headings using signals received from an off-board, external system. The navigation system also includes a magnetic sensor onboard the vehicle system that measures magnetic fields along different axes at different times. One or more processors determine a combination of the magnetic fields, determine a position translation and/or a magnitude scaling of the combination of the magnetic fields, and modify at least one of the headings based on the position translation and/or the magnitude scaling.

20 Claims, 15 Drawing Sheets

(56) References Cited

U.S. PATENT DOCUMENTS

| | | | |
|---|---|---|---|
| 2004/0123474 A1 | 7/2004 | Manfred et al. | |
| 2007/0163132 A1 | 7/2007 | Parks et al. | |
| 2008/0201096 A1* | 8/2008 | Wright | G01C 17/38 |
| | | | 702/92 |
| 2014/0361763 A1 | 12/2014 | Chow et al. | |
| 2015/0354980 A1 | 12/2015 | Wahdan et al. | |
| 2016/0097875 A1 | 4/2016 | Kowalczyk et al. | |
| 2016/0362123 A1 | 12/2016 | Schultz et al. | |
| 2017/0008521 A1 | 1/2017 | Braunstein et al. | |
| 2017/0369083 A1 | 12/2017 | Pulliam et al. | |

OTHER PUBLICATIONS

International Search Report dated Jan. 22, 2019 for corresponding patent application No. PCT/US2018/059787.
Written Opinion of the International Searching Authority dated Jan. 22, 2019 for corresponding patent application No. PCT/US2018/059787.
International Preliminary Report on Patentability for corresponding International Application No. PCT/US2018059787 dated May 22, 2020. 7 Pages.

* cited by examiner

122 — THE "a" OF THE MAGNETIC "ELLIPSE" IS CALCULATED AS THE RATIO OF THE DIFFERENCE BETWEEN THE CURRENT GPS HEADING'S AVERAGE MAGNETIC FIELD FOR X AND THE ADJACENT (MINUS 1) GPS HEADING'S AVERAGE MAGNETIC FIELD FOR X TO THE DIFFERENCE BETWEEN THE SINE OF THE CURRENT GPS HEADING AND THE SINE OF THE ADJACENT GPS HEADING. [STORED]

124 — THE "b" OF THE MAGNETIC "ELLIPSE" IS CALCULATED AS THE RATIO OF THE DIFFERENCE BETWEEN THE CURRENT GPS HEADING'S AVERAGE MAGNETIC FIELD FOR Z AND THE ADJACENT (MINUS 1) GPS HEADING'S AVERAGE MAGNETIC FIELD FOR Z TO THE DIFFERENCE BETWEEN THE COSINE OF THE CURRENT GPS HEADING AND THE COSINE OF THE ADJACENT GPS HEADING. [STORED]

126 — THE MAGNETIC "ELLIPSE" POSITION TRANSLATION ALONG THE X-AXIS IS CALCULATED AS THE MEDIAN OF THE AVERAGE MAGNETIC FIELD FOR X FOR ALL (360) GPS HEADINGS MINUS THE MEDIAN OF THE "a"s FOR ALL GPS HEADINGS TIMES THE MEDIAN OF THE SINE OF THE GPS HEADINGS FOR ALL GPS HEADINGS.

128 — THE MAGNETIC "ELLIPSE" POSITION TRANSLATION ALONG THE Z-AXIS IS CALCULATED AS THE MEDIAN OF THE AVERAGE MAGNETIC FIELD FOR Z FOR ALL (360) GPS HEADINGS MINUS THE MEDIAN OF THE "b"s FOR ALL GPS HEADINGS TIMES THE MEDIAN OF THE COSINE OF THE GPS HEADINGS FOR ALL GPS HEADINGS.

FIG. 2B

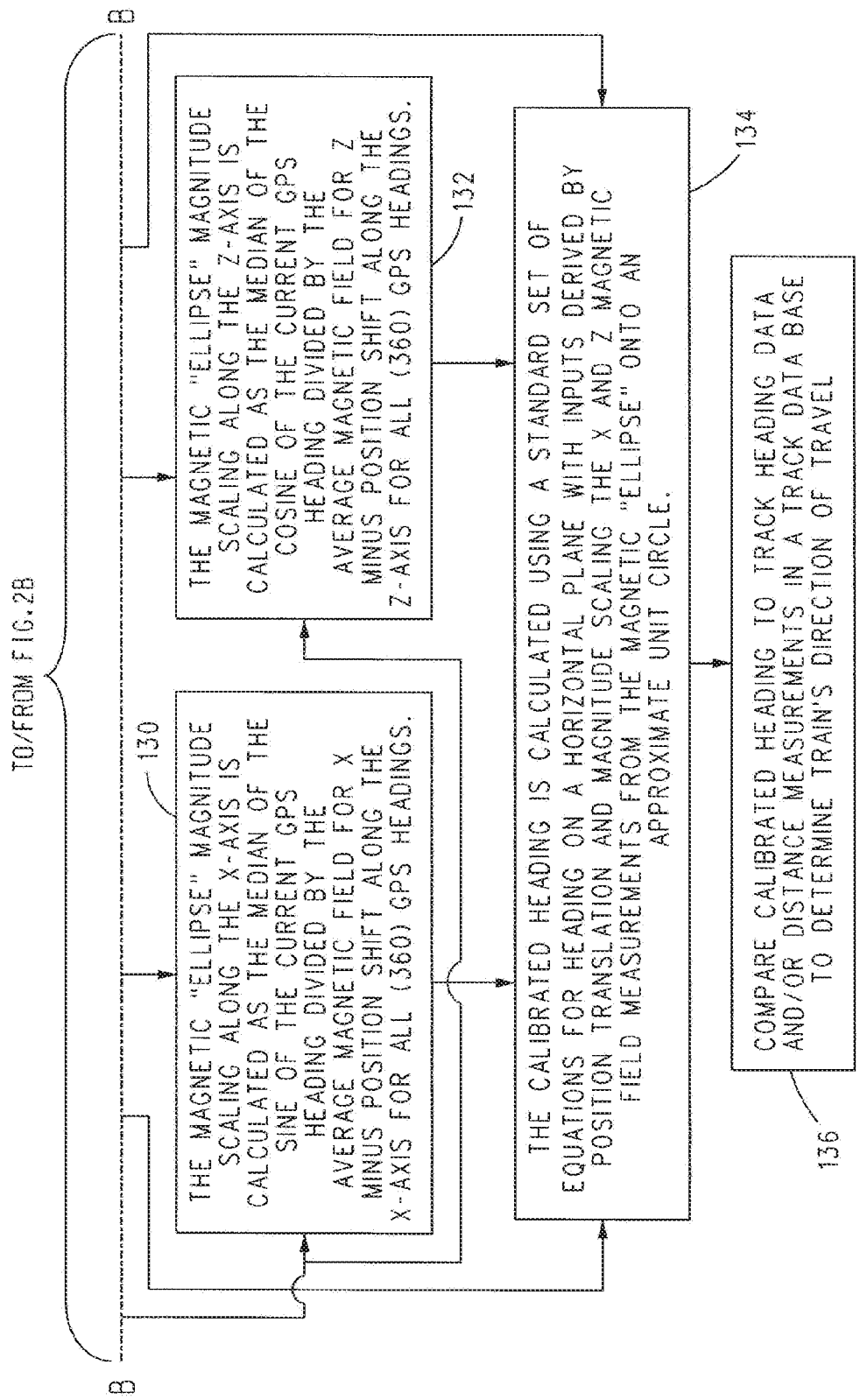

VEHICLE NAVIGATION SYSTEM

CROSS REFERENCE TO RELATED APPLICATIONS

This application is a continuation-in-part of International Application No. PCT/US2018/059787, filed 16 May 2019, which claims the benefit of U.S. Provisional Application No. 62/583,623, filed Nov. 9, 2017. The entire contents of these applications are incorporated herein by reference.

BACKGROUND

Technical Field

The subject matter described herein relates to navigation associated with a vehicle control system and, in particular, to a system for heading calibration of a vehicle.

Description of Art

Some vehicle control systems, such as Positive Train Control (PTC) systems, may rely upon navigation systems to determine the heading of a moving vehicle system and to determine which heading the vehicle system will be moving in an upcoming route. The determination of the heading can generally be broken down into two modes—initial heading determination and determination of the heading throughout the route.

The initial heading can be determined through various methods such as stored global positioning system (GPS) heading or crew interaction. Stored GPS heading may require a known GPS heading whenever the vehicle system stops moving and knowledge of the vehicle system not moving. Thus, a loss of GPS signal or a vehicle system being moved by another vehicle would decrease reliability. Although crew interaction with cab displays could input the heading, there is an undesired aspect of relying upon a human for input to a safety critical system. In some known PTC systems, such as I-ETMS® of Wabtec Corp., the need for an initial heading determination can occur when a system is activated by the vehicle system traveling a certain distance. The frequency of requiring determining initial heading and the potential of error with existing systems warrants the need for an improvement of the known systems and methods.

The determination of the heading throughout the route aspect has also been addressed through various methods, such as stored GPS heading or crew interaction. For predictive enforcement of conditions ahead of the vehicle system, the solution of determining the heading may be most appropriate as this solution allows the PTC system to determine which direction the vehicle system will be traveling prior to moving along a route. There are, however, other cases where predictive enforcement is not needed, yet determination of the route being taken is still desirable. Specifically, these cases relate to operation in passenger terminal areas that may be excluded from PTC requirements. These terminal areas often have short distances that a vehicle system can move before entering a PTC required track. A further challenge in these areas is that GPS may be partially or totally obscured by buildings or through underground operation.

BRIEF SUMMARY

In one embodiment, a vehicle navigation system includes an external source sensor configured to be disposed onboard a vehicle system and determine headings of the vehicle system. The external source sensor is configured to determine the headings using signals received from one or more external systems disposed off-board the vehicle system. The navigation system also includes a magnetic sensor configured to be disposed onboard the vehicle system and to measure magnetic fields along two or more different axes at different times. The navigation system also includes one or more processors configured to determine a combination of the magnetic fields that are determined at the different times, to determine one or more of a position translation or a magnitude scaling of the combination of the magnetic fields, and to modify at least one of the headings determined by the external source sensor based on the one or more of the position translation or the magnitude scaling of the combination of the magnetic fields.

In one embodiment, a method for determining headings of a vehicle system includes determining headings of a vehicle system using an external source sensor that receives signals from one or more external systems disposed off-board the vehicle system, measuring magnetic fields along two or more different axes at different times using a magnetic sensor disposed onboard the vehicle system, determining a combination of the magnetic fields that are determined at the different times, determining one or more of a position translation or a magnitude scaling of the combination of the magnetic fields, and modifying at least one of the headings determined by the external source sensor based on the one or more of the position translation or the magnitude scaling of the combination of the magnetic fields.

In one embodiment, a vehicle navigation system includes a global positioning system (GPS) receiver configured to be disposed onboard a vehicle system and to determine headings of the vehicle system, a magnetic sensor configured to be disposed onboard the vehicle system and to measure magnetic fields at different times, and one or more processors configured to determine a combination of the magnetic fields that are determined at the different times, to determine a position translation and a magnitude scaling of the combination of the magnetic fields, and to modify at least one of the headings determined by the GPS receiver based on the position translation and the magnitude scaling of the combination of the magnetic fields.

BRIEF DESCRIPTION OF THE DRAWINGS

FIGS. 2A-C illustrate a flowchart depicting inputs and operations thereon in accordance with one example;

DETAILED DESCRIPTION

Figure 1:
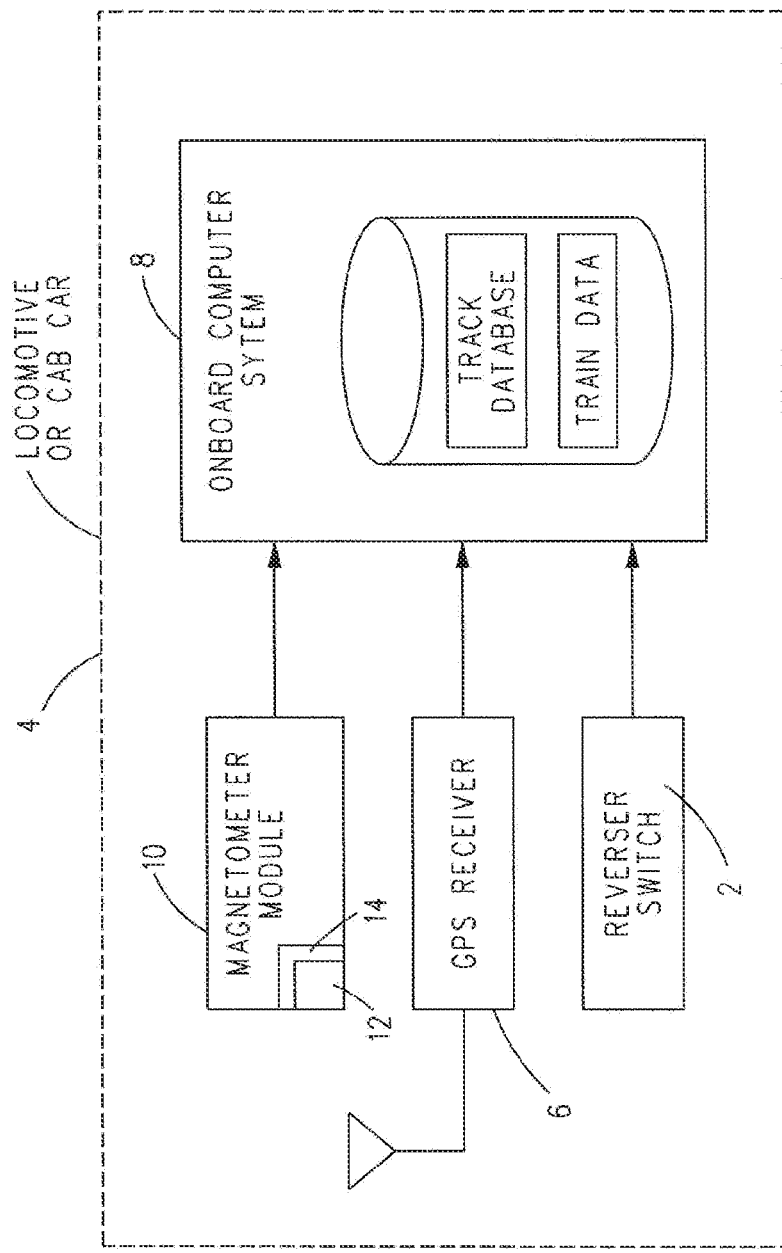
FIG. 1 illustrates one example of a vehicle navigation system.

In one or more embodiments of the inventive subject matter described herein, a vehicle navigation system and method for controlling movement of a vehicle system is provided. The navigation system and method can manage movement authorities in a positive vehicle control system. A positive vehicle control system is a system that restricts or prevents certain movements of a vehicle system unless and until a positive signal is received indicating that the vehicle system can proceed. For example, the positive vehicle control system can prevent a vehicle system from entering into a segment or block of a route unless a signal is received that indicates that the vehicle system can proceed into the route segment or route block. One example of a positive vehicle control system is a PTC system.

In one non example, a vehicle navigation system is provided that determines or calibrates headings of a vehicle to aid in navigation and controlling movement of the vehicle. The vehicle navigation system can include a reverser control switch configured to communicate data representative of a reverser status of a vehicle of the vehicle system, an external source module configured to determine locations and/or headings of the vehicle based on signals sent from an external source that is off-board the vehicle and/or vehicle system, and a magnetometer module configured to determine respective magnetic fields for two or more axes (e.g., X- and Z-axes) relative to the magnetometer module. The external source module also can be referred to as an external source sensor, and can include one or more sensors, devices, receivers, or the like, that receive signals from one or more external devices or systems located off-board the vehicle and/or vehicle system, and that determine the heading, location, and/or speed of the vehicle or vehicle system based on the information included in the signals that are received. For example, the external source can include GPS satellites that communicate GPS signals and the external source module can be a GPS receiver that receives the GPS signals and determines the heading and/or location of the GPS receiver. As another example, the external source can be a cellular tower that communicates wireless signals and the external source module can be a transceiver that receives the wireless signals and determines the heading and/or location of the transceiver (e.g., using wireless triangulation).

The vehicle control system also can include an onboard computer situated on the vehicle system that is configured to calculate average magnetic fields along different axes during movement of the vehicle system and plot the average magnetic fields as a partial ellipse having a position and magnitude on the same axes. The average magnetic fields can include an average magnetic field of a current heading and average magnetic fields of prior headings. The onboard computer also can be configured to calculate semi-major axis and semi-minor axis values corresponding to respective points on the partial ellipse using the average magnetic field of the current heading and an average magnetic field of an adjacent (e.g., the most recent or prior) GPS headings. The onboard computer also can be configured to perform a position translation of the partial ellipse along the different axes using the average magnetic fields along these axes, the semi-major axis and semi-minor axis values, and the headings. The onboard computer also can be configured to perform a magnitude scaling of the partial ellipse along the different axes using the current heading, the average magnetic fields along the same axes, and the position translation. The position translation and magnitude scaling can provide transformed magnetic field values for the different axes. The onboard computer also can be configured to calculate a calibrated heading using equations for heading on a plane (e.g., the horizontal plane) using the position translated and a magnitude scaled partial ellipse.

The vehicle systems and vehicles described herein may be rail vehicles. For example, the vehicle systems may be trains and the vehicles may be locomotives, rail cars, passenger cars, or the like. Optionally, the vehicles may be other types of vehicles, such as automobiles, trucks, buses, marine vessels, agricultural vehicles, mining vehicles, etc. The vehicle systems may be formed from one or more propulsion-generating vehicles (e.g., locomotives, automobiles, trucks, marine vessels, etc.) and optionally one or more non-propulsion-generating vehicles (e.g., rail cars, passenger cars, trailers, barges, etc.). The propulsion-generating vehicles in the vehicle systems may be directly or indirectly coupled with each other (e.g., by couplers) or may not be coupled with each other. For example, the propulsion-generating vehicles may communicate with each other to coordinate movements so that the vehicles move together in a convoy as a vehicle system.

In one example, the position translation and magnitude scaling of the partial ellipse (e.g., the transformed X and Z magnetic field values) can produce a unit circle.

Following calculating the calibrated heading, the onboard computer can compare the calibrated heading to a route database to determine a heading of the vehicle or vehicle system.

As one example, the calibrated heading can be determined using one or more of the following relationships:

$$\text{Dir}(90°){:}([(X{-}Xcal\_p)*Xcal\_m]{>}0){=}90°{-}\text{arcTan}([(Z{-}Zcal\_p)*Zcal\_m]/[(X{-}Xcal\_p)*Xcal\_m])*(180°/\pi);$$

$$\text{Dir}(270°){:}([(X{-}Xcal\_p)*Xcal\_m]{<}0){=}270°{-}\text{arcTan}([(Z{-}Zcal\_p)*Zcal\_m]/[(X{-}Xcal\_p)*Xcal\_m])*(180°/\pi);$$

$$\text{Dir}(180°){:}([(X{-}Xcal\_p)*Xcal\_m]{=}0 \text{ AND } [(Z{-}Zcal\_p)*Zcal\_m]{<}0){=}180°;$$

$$\text{Dir}(0°){:}([(X{-}Xcal\_p)*Xcal\_m]{=}0 \text{ AND } [(Z{-}Zcal\_p)*Zcal\_m]{>}0){=}0°; \text{ and}$$

$$\text{Dir}(0°){:}([(X{-}Xcal\_p)*Xcal\_m]{=}0 \text{ AND } [(Z{-}Zcal\_p)*Zcal\_m]{=}0){=}\text{ERROR}$$

where:
$X$=present (e.g., currently measured or most recently measured) magnetic field along the X axis;
$Z$=present magnetic field along the X axis;

$$Xcal\_p{=}\text{MEDIAN}(\text{All Deg GPS}[\text{Avg Mag } X]){-}(\text{MEDIAN}(\text{All Deg GPS}[a])*\text{MEDIAN}(\text{All Deg GPS}[\text{Sine}(\text{Deg})]));$$

$$Zcal\_p{=}\text{MEDIAN}(\text{All Deg GPS}[\text{Avg Mag } Z]){-}(\text{MEDIAN}(\text{All Deg GPS}[b])*\text{MEDIAN}(\text{All Deg GPS}[\text{Cosine}(\text{Deg})]));$$

$$Xcal\_m{=}\text{MEDIAN}(\text{All Deg GPS}[\text{Unit}\_X]); \text{ and}$$

$$Zcal\_m{=}\text{MEDIAN}(\text{All Deg GPS}[\text{Unit}\_Z]).$$

In one example, the system can provide improved efficiency in navigation for vehicle operations, especially when transitioning to an active operating state. During a disengaged operating state (e.g., the vehicle system is not moving or is otherwise turned off), location determining systems (such as GPS) may be unable to determine a heading until the vehicle system travels a certain distance. For this reason, some current vehicle control systems (such as PTC) may need to have the vehicle system move a certain distance before the heading of the vehicle system can be determined. The inability to activate before movement and the desire for operators to reduce crew interaction with the vehicle control system calls for the need to improve upon the current design. Standard physical and digital compasses may not be able to accurately determine a heading within a vehicle, since the magnetic fields inside and outside of the vehicle can change during travel. Moreover, magnetic fields detected inside of a vehicle can be affected by materials forming the vehicle. For example, the outside surface of a vehicle may be formed of electrically conductive material, magnetically conductive material, or a combination of electrically and magnetically conductive materials.

Use of a combination of a location determining system (e.g., GPS) and inertial navigation sensors (e.g., magnetometers) can allow a vehicle to determine the heading of the vehicle. A computer algorithm can use the heading that is output of the location determining system and the corresponding output of the inertial navigation sensors to automatically calibrate the system and calculate the heading of a vehicle. Within the system, the calibration data that describes the "unit-circle compass" (that adjusts to the recent magnetic field) can be repeatedly (e.g., continually or otherwise repeated in a non-continuous manner) updated while moving and stored when stopped. The use of redundant location determining systems and inertial navigation sensors can increase the accuracy of the heading that is calculated. The accuracy of the calculated heading can be repeatedly determined during travel. The calibration and accuracy data can be stored from the installation run to the next run of a vehicle system, allowing the second and succeeding runs to start with a known heading based on the previous calibration data. Only a few degrees of motion may be needed for calibration to occur. When the heading is known, a vehicle system may be able to navigate more effectively, especially with the ability to activate a positive vehicle control system without first moving the designated distance.

Some operators run in a push-pull configuration and the crews swap ends of vehicle systems before leaving a terminal area. As a result, there may be a need to provide the accurate navigation solution to the positive vehicle control system at each end of the vehicle system. One or more embodiments of the inventive subject matter described herein provide a way for that navigation information to be available at both ends of the vehicle system. It is to be understood that the aspects of this inventive subject matter may be applied to any type of vehicle control system (i.e., not just trains and railway related equipment) that can use an accurate heading upon initialization and throughout travel (e.g., in environments with changing magnetic fields).

These and other features and characteristics of the inventive subject matter, as well as the methods of operation and functions of the related elements of structures and the combination of parts and economies of manufacture, will become more apparent upon consideration of the following description and the appended claims, if any, with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and the claims, if any, the singular form of "a", "an", and "the" include plural referents unless the context clearly dictates otherwise.

A non-limiting example will now be described with reference to the accompanying figures, where like reference numbers correspond to like or functionally equivalent elements.

For purposes of the description hereinafter, the terms "end", "upper", "lower", "right", "left", "vertical", "horizontal", "top", "bottom", "lateral", "longitudinal" and derivatives thereof shall relate to the invention as it is oriented in the drawing figures. It is to be understood that the invention may assume various alternative variations and step sequences, except where expressly specified to the contrary. It is also to be understood that the specific devices and processes illustrated in the drawings, and described in the following specification, are simply exemplary embodiments of the invention. Hence, specific dimensions and other physical and/or processing characteristics related to the embodiments disclosed herein are not to be considered as limiting.

As used herein, the term "communication" and "communicate" (and derivatives, such as "communicatively") refer to the receipt or transfer of one or more signals, messages, commands, or other type of data. For one unit or component to be in communication with another unit or component means that the one unit or component is able to directly or indirectly receive data from and/or transmit data to the other unit or component. This can refer to a direct or indirect connection that may be wired and/or wireless in nature. Additionally, two units or components may be in communication with each other even though the data transmitted may be modified, processed, routed, and the like, between the first and second unit or component. For example, a first unit may be in communication with a second unit even though the first unit passively receives data, and does not actively transmit data to the second unit. As another example, a first unit may be in communication with a second unit if an intermediary unit processes data from one unit and transmits processed data to the second unit. It will be appreciated that numerous other arrangements are possible.

With reference to FIG. 1, in one non-limiting embodiment or example, a vehicle navigation system for determining a heading of a vehicle or vehicle system is disclosed. The vehicle control system can have various components associated therewith, including a reverser control switch 2 configured to communicate data representative of a reverser status of a propulsion-generating vehicle 4 of the vehicle system, an external source module 6 (e.g., a GPS receiver) configured to output a plurality of headings of the vehicle 4, and an inertial or magnetic navigation sensor 10 (e.g., a magnetometer module) configured to determine respective magnetic fields for X- and Z-axes relative to the magnetic navigation sensor. These components can provide data for use by an onboard computer system 8 that can also be situated on the vehicle system and communicatively connected with the aforementioned components. Alternatively, the computer system 8 may be situated remotely from the vehicle system and data can be wirelessly sent to and from the vehicle system. The components may be located in each propulsion-generating vehicle or non-propulsion-generating vehicle of a vehicle system. Multiple propulsion-generating vehicles and/or non-propulsion-generating vehicles may be in a vehicle system to allow for adjusting the size of the vehicle system to match passenger and/or cargo demand. The inventive subject matter may apply to the vehicles at each end of the vehicle system, but may also apply to those within the middle of the vehicle system or otherwise not at an end of the vehicle system, as a change in the vehicle system may cause the vehicles to become a controlling vehicle. The inventive subject matter also may be used where a propulsion-generating vehicle is not in the vehicle system, but multiple controlling other vehicles are in the vehicle system.

In one example, the magnetic sensor 10 may include a magnetometer integrated circuit 12, which may be a part of a magnetic sensor 14, such as inertial Navigation Sensor Module NSM-04® of Wabtec Corp. The magnetometer integrated circuit 12 may be configured to provide 3-axis (X, Y, and Z) data at 5 Hz, for example. Sensor 14 may measure magnetic fields using magneto-resistive sensors and communicate a digital signal that the NSM-04® software converts to milligauss (mG). Other inertial navigation sensors that may be utilized in connection with the inventive subject matter include, but are not limited to, gyroscopes and accelerometers that measure directional changes for the vehicle where positive vehicle control system equipment is located.

In one example, the external source sensor 6 (which also can be referred to as a location determining device), with accompanying antenna, may provide heading data when moving at 1 Hz using National Marine Electronic Association (NMEA) message Recommended Minimum Data (RMD) named Cog (Course over ground) in degrees. It is to be understood that other messaging may be implemented.

The reverser control switch 2 can be configured to output a forward/reverse signal corresponding to whether the heading of the vehicle system is selected (e.g., by an operator or automatic control system) as moving forward or in reverse.

The onboard computer system 8 may perform all of the calculations for a positive vehicle control system, and may be configured to perform calculations for navigation as may be relevant to the inventive subject matter. Onboard computer system 8 may be communicatively connected to other systems or data sources that may provide information relevant to the implementation of the inventive subject matter. For example, onboard computer system 8 may include or have access to a route database that may include data about route headings, layouts, and distance measurements. Onboard computer system 8 may also include or have access to vehicle system data, such as consist information that can include the number, category (e.g., propulsion-generating or non-propulsion-generating), and/or location of vehicles in the vehicle system. Consist information may also include the total length of the vehicle system and the specific identification numbers of each vehicle where positive vehicle control system equipment can be located. Herein, reverser control switch 2, location determining device 6, magnetic sensor 10, and onboard computer system 8 will be described as being situated on the propulsion-generating vehicle 4. Optionally, the reverser control switch 2, location determining device 6, magnetic sensor 10, and/or onboard computer system 8 can be situated on one or more other vehicles of the vehicle system.

One example of acquisition of input data, application of algorithms applied thereto, and the resultant output data will now be discussed in connection with the accompanying figures.

Figure 2A:
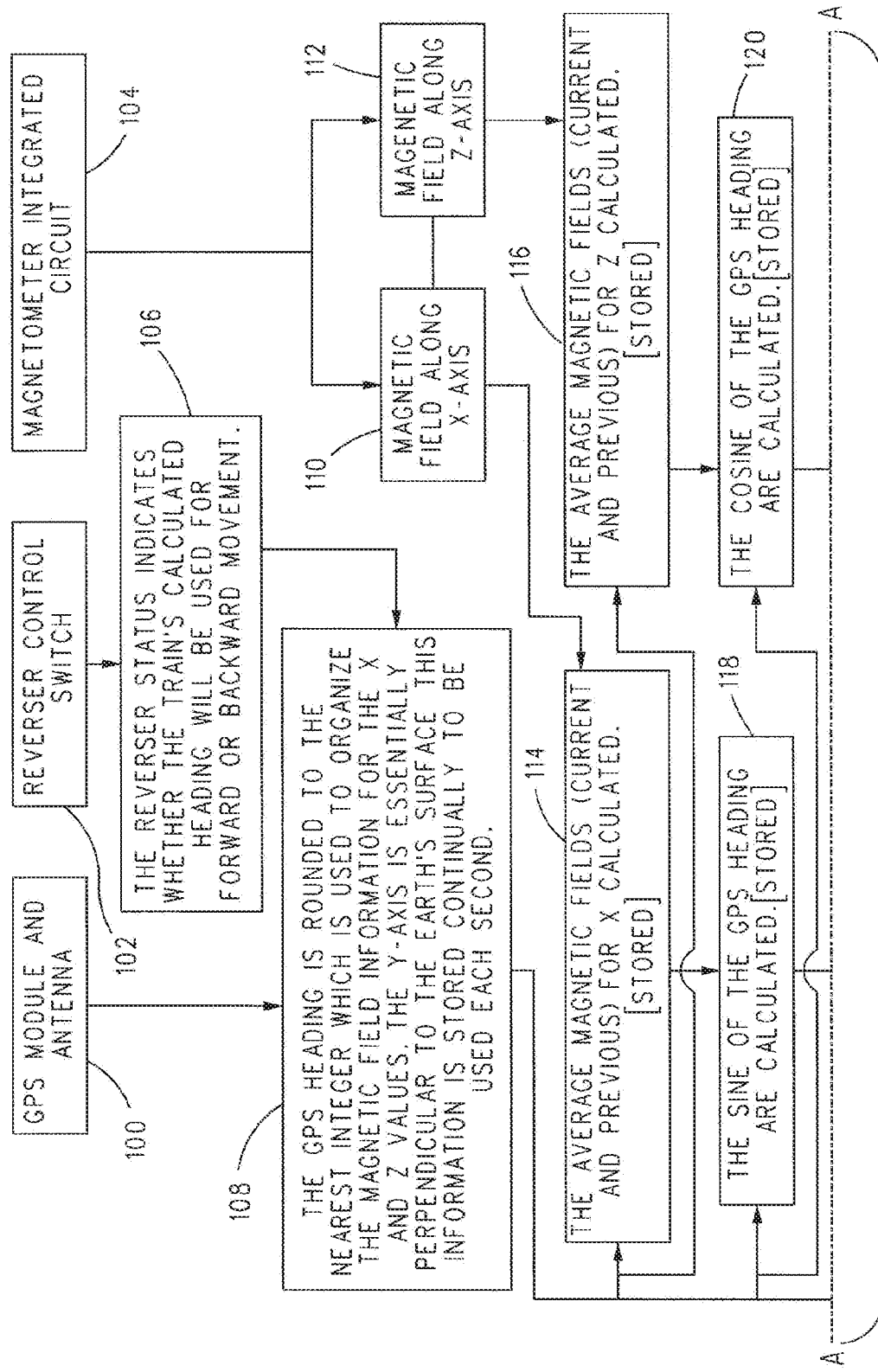
Figure 3:
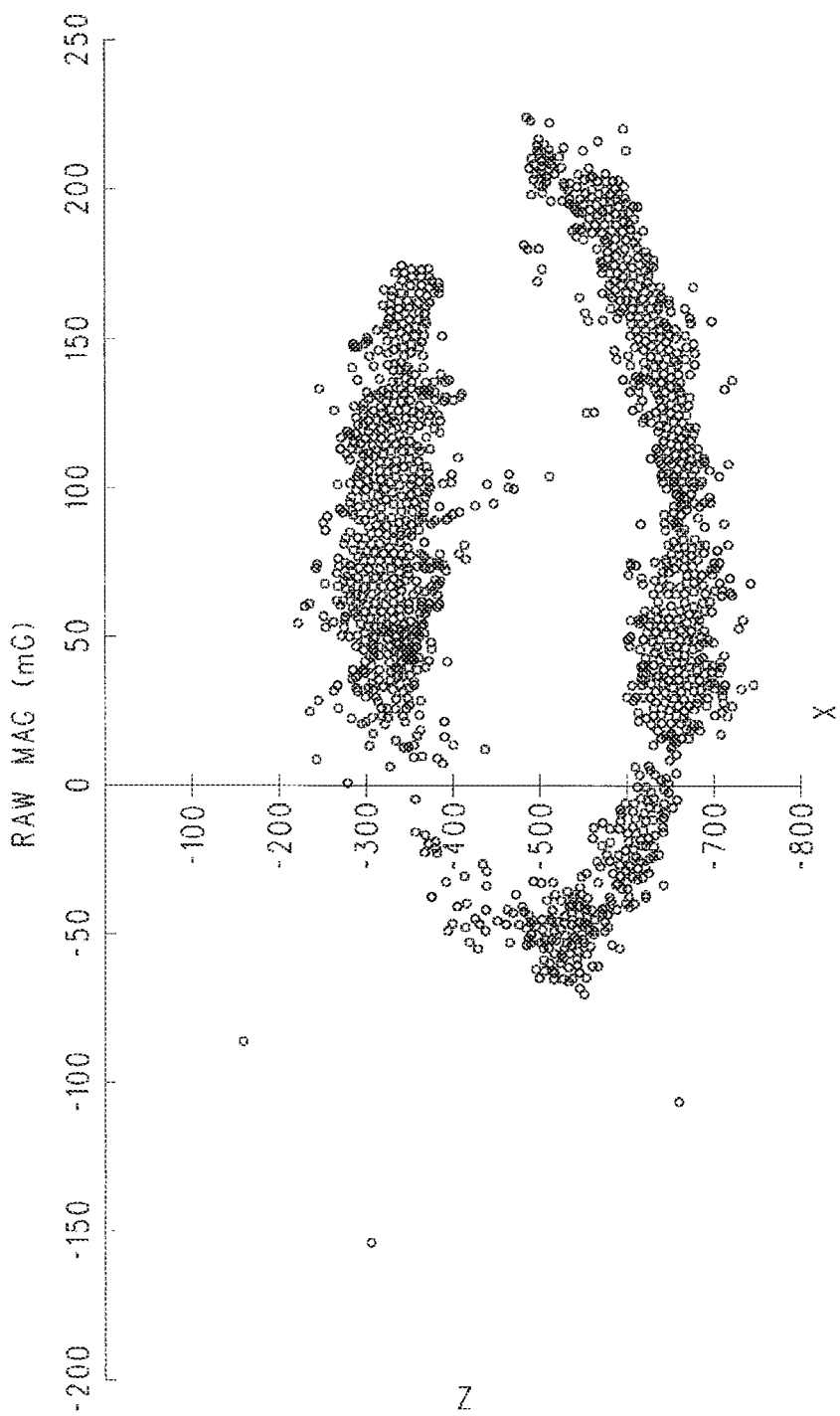
FIG. 3 illustrates a plot depicting raw magnetic field measurements acquired using a magnetometer.

In one example, as shown for example in the flow chart of FIG. 2, onboard computer 8 can acquire data from reverser switch 2 (at 102), location determining device 6 (at 100), and magnetometer integrated circuit 12 (at 104) on a repeated basis during movement of the vehicle system. This data can include the reverser switch 2 status, heading, and the average magnetic field (of five signals, for example) for several axes, such as X, Y, and Z axes. As shown in 106, the reverser switch 2 status can indicate whether the calculated heading of the vehicle system will be used for forward or backward movement. At 108, the heading may be rounded to the nearest integer which can be used to organize the magnetic field information for the X axis (at 110) and the Z axis (at 112). In an example, the X-axis can represent latitude or magnetic north and the Z-axis can represent longitude or a direction perpendicular to magnetic north. The Y-axis may be considered essentially perpendicular to the Earth's surface and may optionally be used for fine tuning purposes. This information can be stored to onboard computer system 8 continually, periodically, or aperiodically and may be addressed during the same time interval. At 114 and 116, the average magnetic fields (current and previous) for both axes can be determined and stored, for example, as shown in FIG. 3. At 118 and 120, the sine and cosine of the heading also can be determined and stored.

Figure 4:
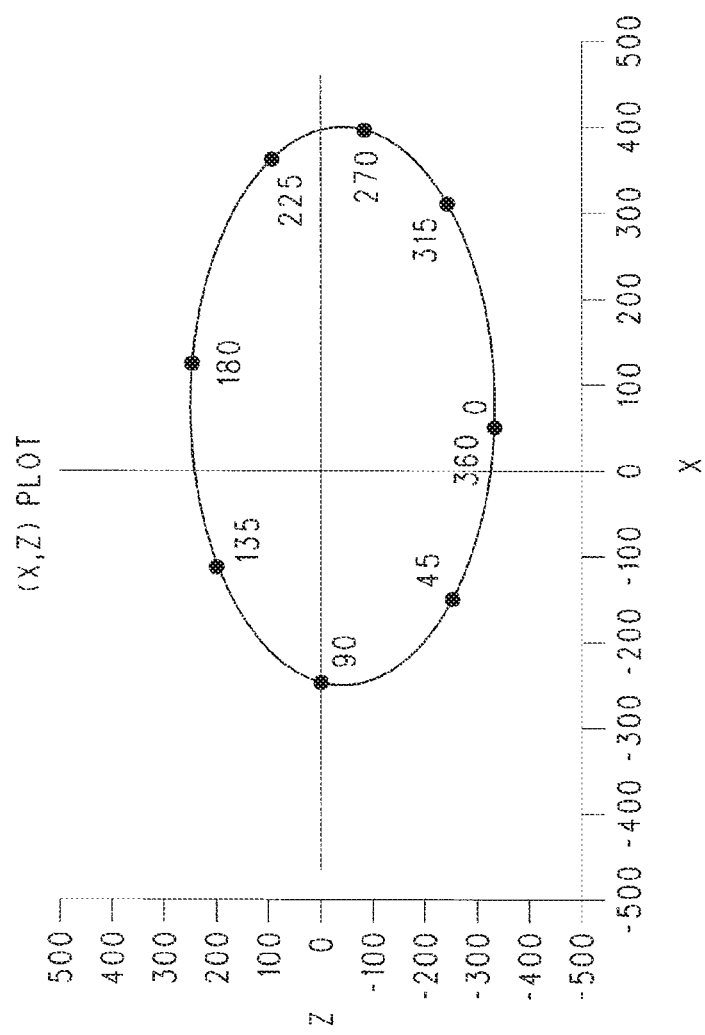
FIG. 4 illustrates a plot of uncalibrated headings based on the raw magnetic field measurements of FIG. 3 and plotted as a partial ellipse.

Next, with reference to the X, Z plot shown, for example, in FIG. 4, and with continuing reference to FIG. 2, at 114 and 116, the X and Z average magnetic fields during movement can be plotted as a partial ellipse (FIG. 4) having a position and magnitude on X- and Z-axes, wherein the average magnetic fields can include a current heading's average magnetic field (e.g., an average magnetic field corresponding to the current heading) and prior (the previously measured) headings' average magnetic field (e.g., an average magnetic field corresponding to the prior heading).

Figure 5A:
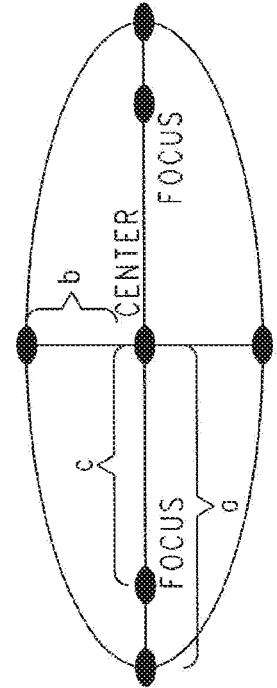
FIGS. 5A and 5B depict a generic ellipse and a generic unit circle, respectively, for the purpose of describing position translation and magnitude scaling of the uncalibrated headings of FIG. 4.
Figure 5B:
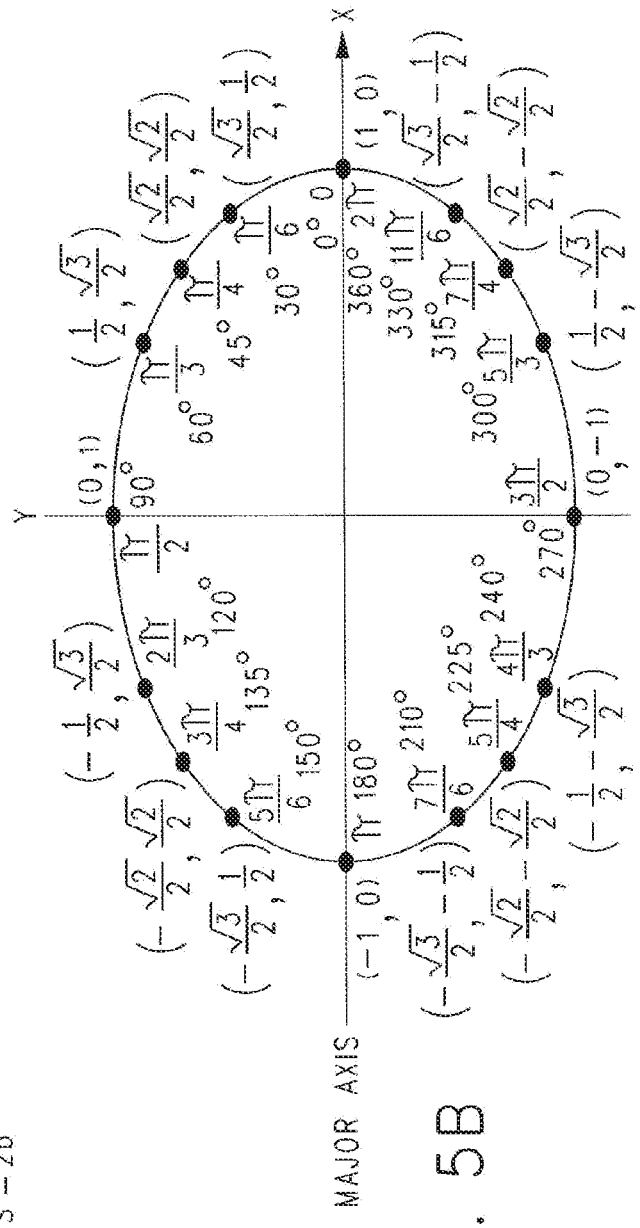

With reference to FIGS. 5A-5B, and with continuing reference to FIG. 2, at 122 and 124 of FIG. 2, a semi-major axis or semi-minor axis along the X-axis (e.g., "a") value and a semi-minor axis or semi-major axis along the Z-axis (e.g., "b") value corresponding to respective points on the partial ellipse can be calculated. The "a" value of the magnetic "ellipse" can be calculated as the ratio of the difference between the average magnetic field for X corresponding to the current heading and the average magnetic field for X corresponding to the adjacent or previous heading to (over) the difference between the sine of the current heading and the sine of the adjacent or previous heading. The "b" value of the magnetic "ellipse" can be calculated as the ratio of the difference between the average magnetic field for Z corresponding to the current heading and the average magnetic field for Z corresponding to the adjacent or prior heading to (over) the difference between the cosine of the current heading and the cosine of the adjacent or prior heading.

Figure 6B:
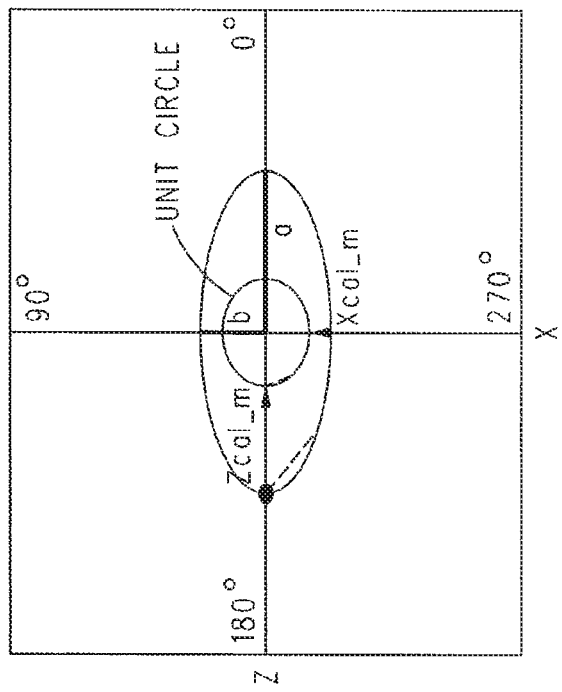
FIGS. 6A and 6B illustrate graphs depicting position translation and magnitude scaling calculations of the uncalibrated headings of FIG. 4.
Figure 6A:
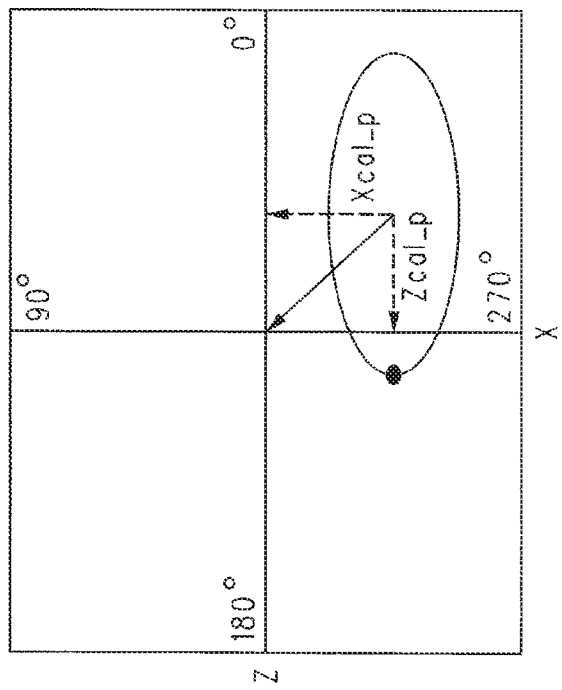
Figure 7:
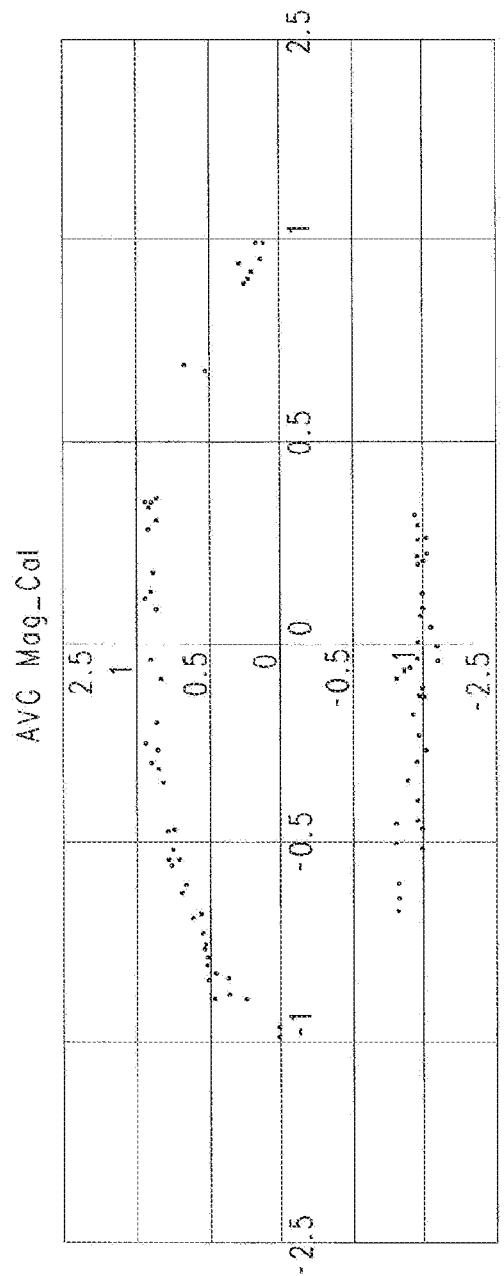
FIG. 7 is a plot of average headings after position translation and (optionally) magnitude scaling calculations of the uncalibrated headings of FIG. 3.

With reference to FIGS. 6A-6B and 7, and with continuing reference to FIG. 2, at 126 and 128 of FIG. 2, a position translation of the partial ellipse shown in FIG. 4 along the X- and Z-axes can be performed (as shown in FIGS. 6A and 6B). The magnetic "ellipse" position translation along the X-axis can be calculated as the median or average magnetic field along X for all stored headings minus the median or average of the "a"s for all stored headings times the median of the sine of the headings for all stored headings. The magnetic "ellipse" position translation along the Z-axis can be calculated as the median of the average magnetic field for Z for all stored headings minus the median of the "b"s for all stored headings times the median of the cosine of the headings for all headings.

Then, at 130 and 132 of FIG. 2, magnitude scaling of the position translated partial ellipse along the X- and Z-axes can be performed to form an approximate unit circle shown, for example, in FIG. 6B. The magnetic "ellipse" magnitude scaling along the X-axis can be calculated as the median or average of the sine of the magnetic field(s) measured for the current heading divided by the median or average magnetic field for the X minus position translation along the X-axis for all or several of the stored headings (at 130). The magnetic "ellipse" magnitude scaling along the Z-axis can be calculated as the median of the cosine of the current heading divided by the average magnetic field for Z minus position translation along the Z-axis for all or several of the stored headings (at 132).

At 134, a calibrated heading can be calculated using equations for heading on a horizontal plane using the position translated and magnitude scaled plot of the transformed X and Z magnetic field values onto the approximate unit circle shown in FIG. 6B. The magnetic field values may encompass three-dimensional values or offset axes that are not constrained to the X and Z axes.

At 136, the resultant calibrated heading may be compared with the route heading data and/or distance measurements in the route database to determine the direction of travel of the vehicle system (e.g., up or down mileposts) along the route. The crew may only be aware of the direction of travel that may be needed for the positive vehicle control system to go an active state.

Figure 8:
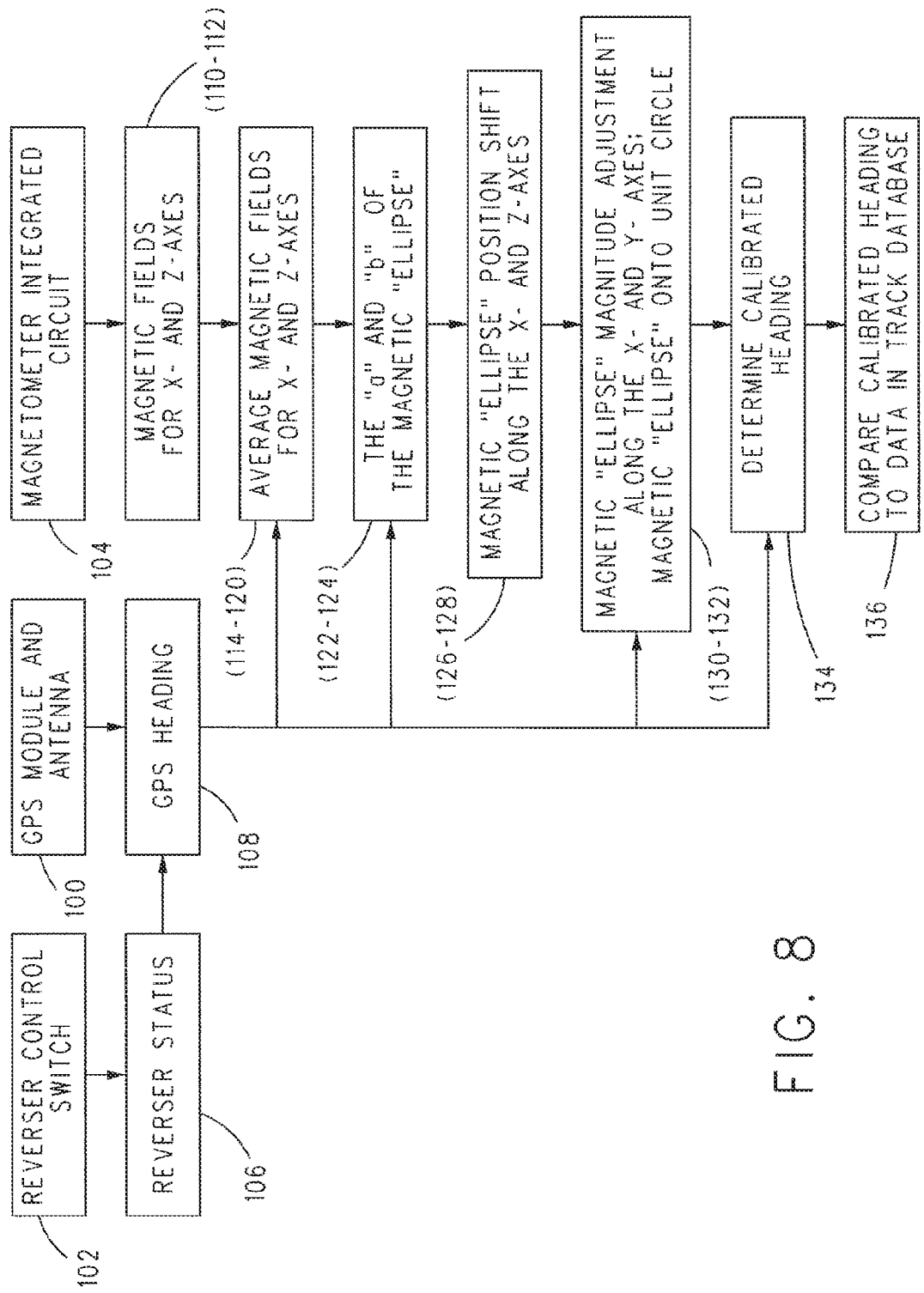
FIG. 8 is another example of the flowchart of FIG. 2.
Figure 9A:
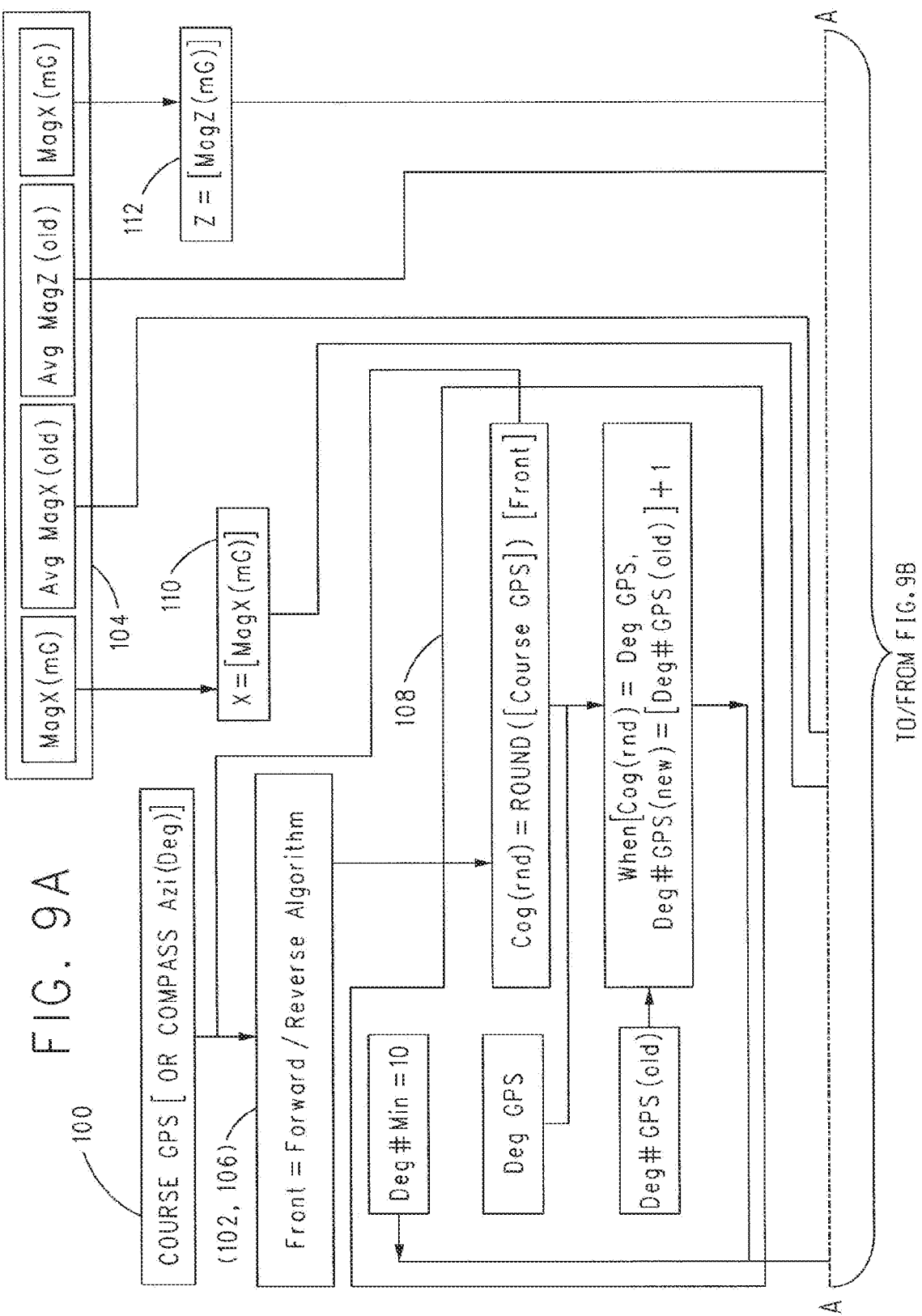
FIGS. 9A-D are an expanded version of the flowchart of the flowchart of FIGS. 2A-C.
Figure 9B:
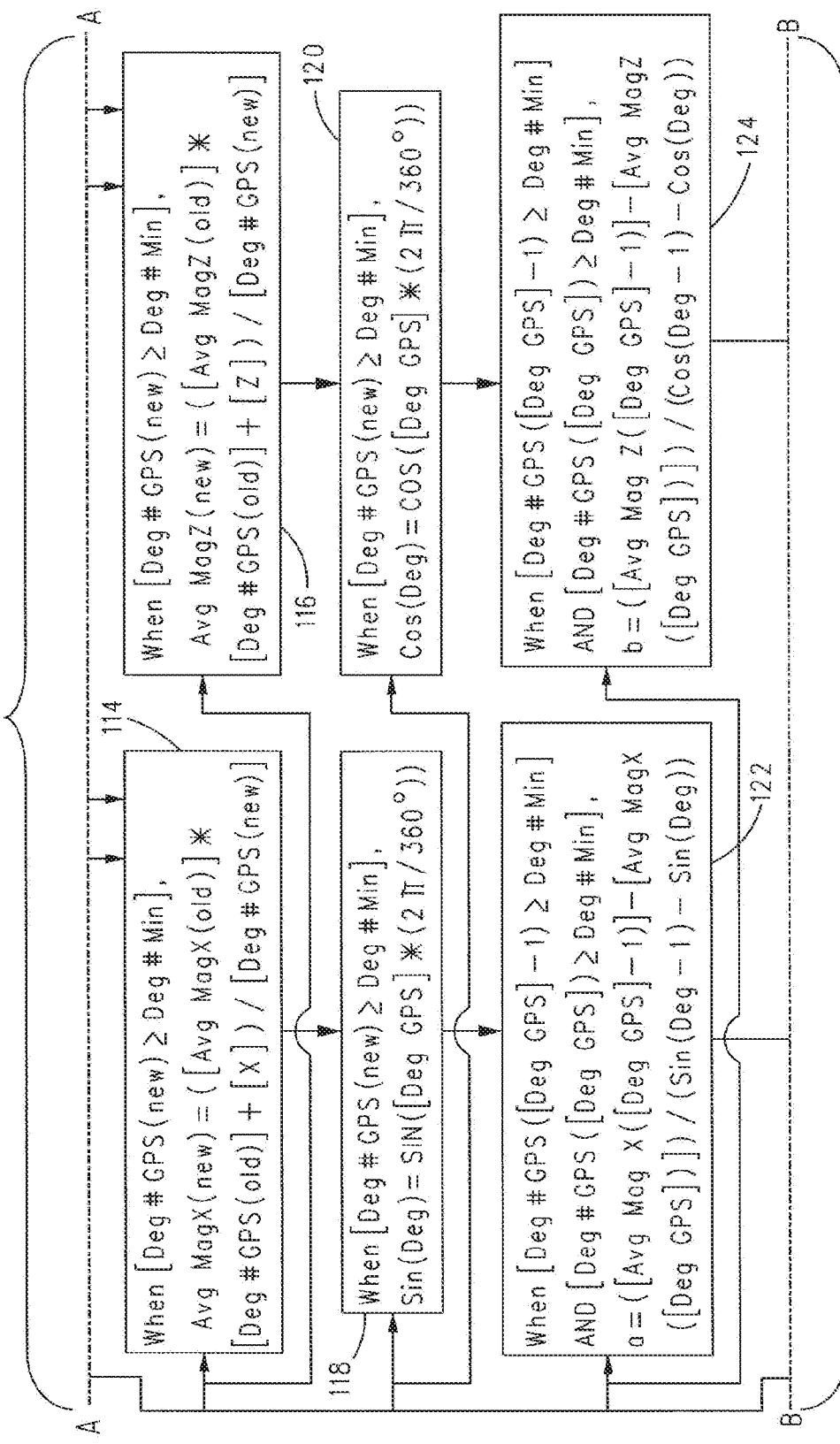
Figure 9C:
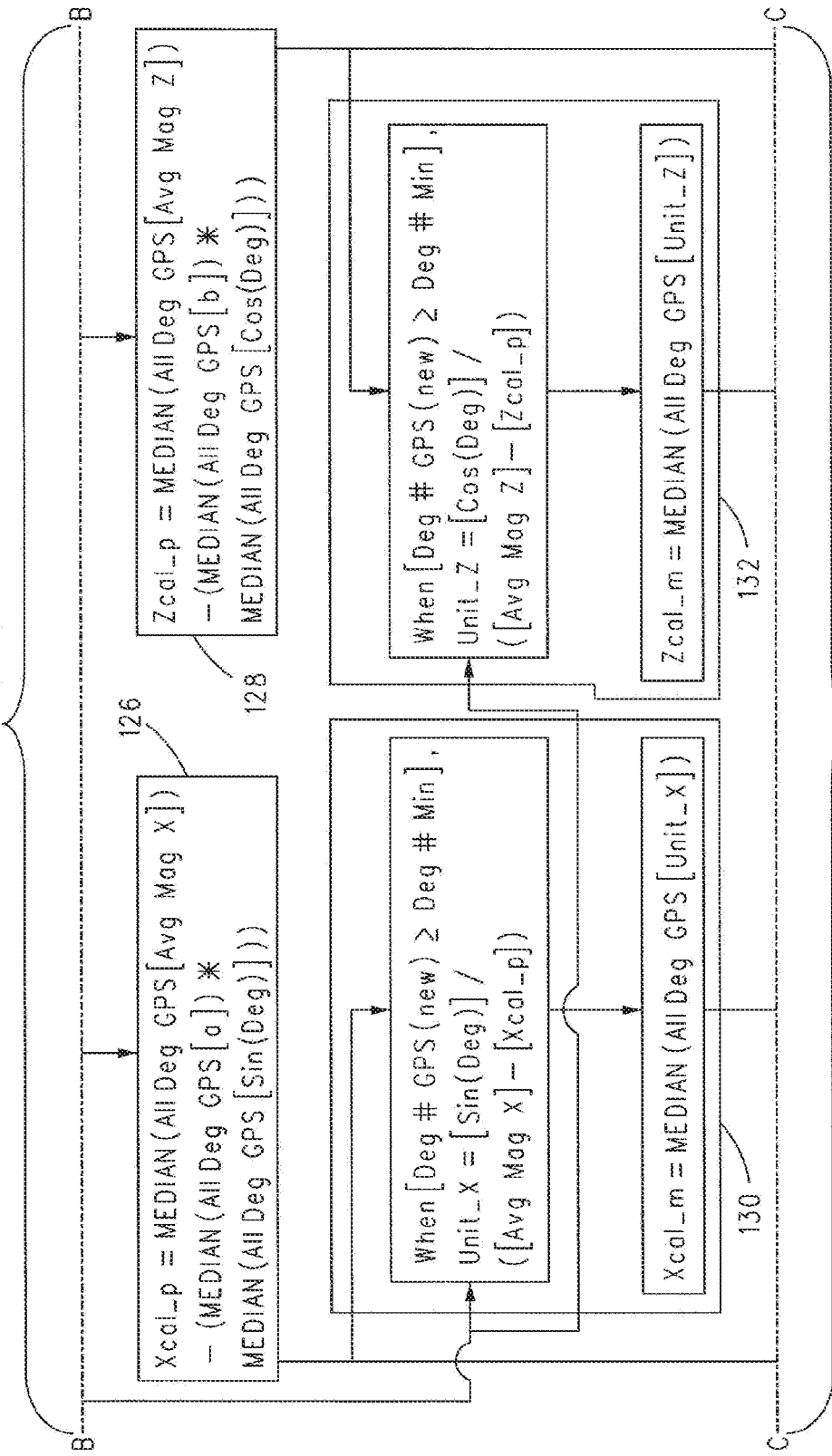
Figure 9D:
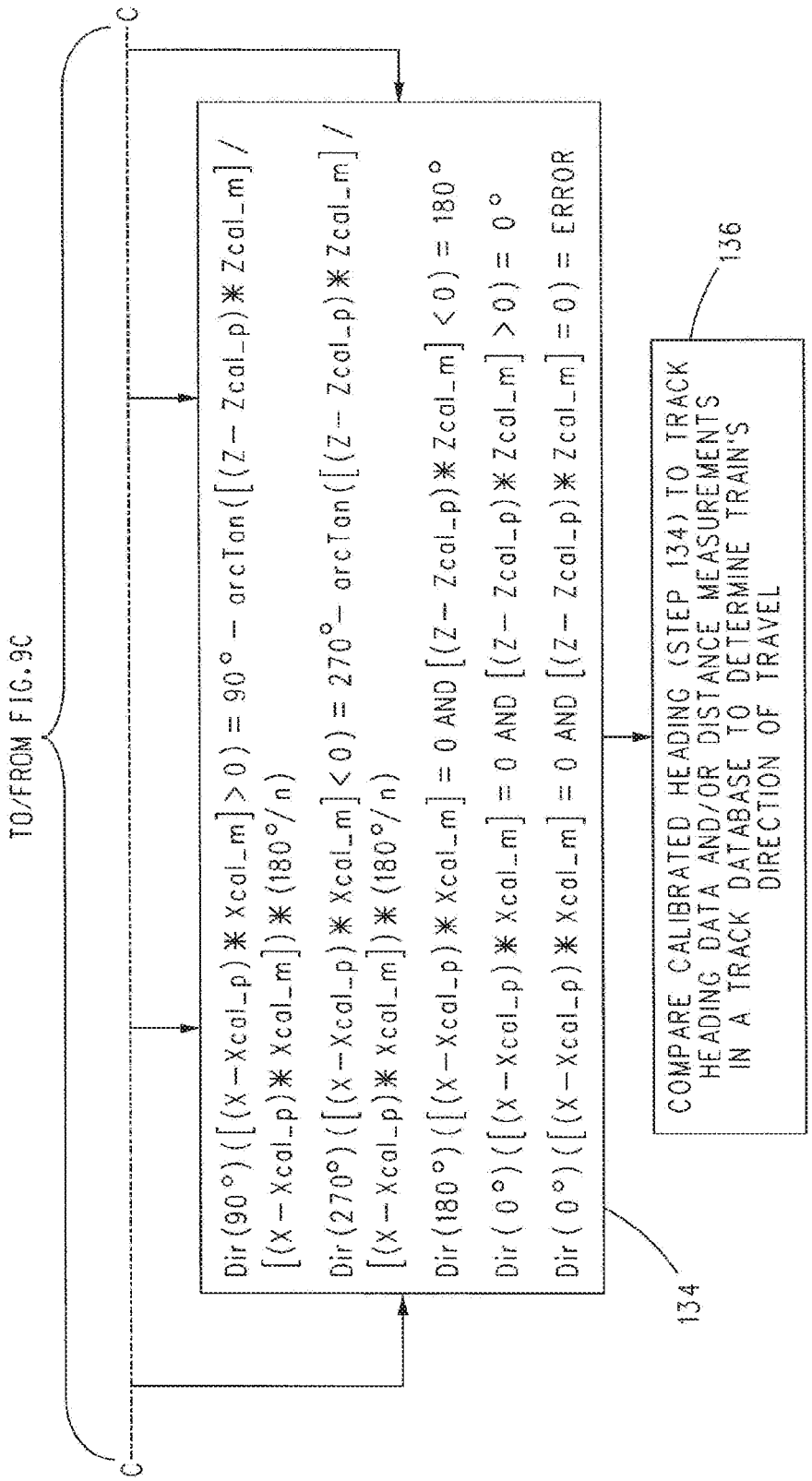

FIG. 8 illustrates another example of the flow chart of FIG. 2.

FIG. 9 is an expanded version of the flow chart shown in FIG. 2. In an example, referring to FIGS. 6A-6B, operations 126, 128, 130, and 132 of FIG. 9 show equations that onboard computer system 8 can use for translating (at 126 and 128) the ellipse from a position offset from a current (X, Z) location (FIG. 6A) of the vehicle or vehicle system to the origin or (0, 0) location of the X, Z coordinate system (FIG. 6B) corresponding to the current X, Z position of the vehicle 4 and magnitude scaling (at 130 and 132) the translated ellipse to a unit circle shown in FIG. 6B.

FIG. 9, at 134, shows equations that onboard computer system 8 can use to calculate or determine the calibrated heading of the vehicle 4 based on the outputs of at least 110, 112, 126, 128, 130 and 132, namely:

$$\text{Dir}(90°): ([(X-X\text{cal}\_p)*X\text{cal}\_m]>0)=90°-\arctan([(Z-Z\text{cal}\_p)Z\text{cal}\_m]/[(X-X\text{cal}\_p)*X\text{cal}\_m])*(180°/\pi);$$ Equation #1:

$$\text{Dir}(270°): ([(X-X\text{cal}\_p)*X\text{cal}\_m]<0)=270°-\arctan([(Z-Z\text{cal}\_p)*Z\text{cal}\_m]/[(X\text{cal}\_p-X)*X\text{cal}\_m])*(180°/\pi);$$ Equation #2:

$$\text{Dir}(180°): ([(X-X\text{cal}\_p)*X\text{cal}\_m]=0 \text{ AND } [(Z-Z\text{cal}\_p)*Z\text{cal}\_m]<0)=180°;$$ Equation #3:

$$\text{Dir}(0°): ([(X-X\text{cal}\_p)*X\text{cal}\_m]=0 \text{ AND } [(Z-Z\text{cal}\_p)*Z\text{cal}\_m]>0)=0°; \text{ and}$$ Equation #4:

$$\text{Dir}(0°): ([(X-X\text{cal}\_p)*X\text{cal}\_m]=0 \text{ AND } [(Z-Z\text{cal}\_p)*Z\text{cal}\_m]=0)=\text{ERROR}.$$ Equation #5:

where:
X can be determined from magnetometer data at 110;
Z can be determined from magnetometer data at 112;
Xcal_p can be determined at 126;
Zcal_p can be determined at 128;
Xcal_m can be determined at 130; and
Zcal_m can be determined at 132.

In an example, as can be understood from an assessment of equations 1 through 5, only one of equations 1 through 5 may be satisfied at each particular X, Z location traveled by the vehicle 4. Where equation 5 is satisfied at a particular X, Z location, no calibrated heading information may be determined by onboard computer system 8 for this location. On the other hand, where one of equations 3 or 4 is satisfied at the particular X, Z location, the direction heading (180° or 0° respectively) can be used as the heading of the vehicle 4. Where the left side (above) of one of equations 1 or 2 is satisfied at the particular X, Z location, the direction heading of the vehicle 4 can be determined by solving the right side of the satisfied equation. Examples of headings 0°, 90°, 180°, and 270° are shown in FIGS. 6A and 6B.

The method(s) represented by FIGS. 2, 8, and 9 can be repeated as often as deemed suitable and/or desirable during movement of the vehicle 4 to provide data from which an updated direction heading of the vehicle 4 can be determined.

As described above, other inertial navigation sensors may be used in connection with the inventive subject matter, either in conjunction with or to supplant the magnetometer. For example, a gyroscope's rotational measurements (in degrees) may be calibrated with the changes of headings (e.g., GPS headings). A calibrated gyroscope may be used to support the calculation of calibrated headings from a magnetometer or be used independently (with sufficient accuracy and frequency). Furthermore, an accelerometer's acceleration measurements may be calibrated with the changes of headings. A calibrated accelerometer may be used to support the calculation of calibrated headings from a magnetometer or be used independently (with sufficient accuracy and frequency). Alternatively, a visually sensed object's rotational measurements (in degrees) may be calibrated with the changes of headings. Thus, a visual sensor network's data may be used to support the calculation of calibrated headings from a magnetometer or be used independently (with sufficient visualization ability and frequency).

Although the inventive subject matter has been discussed herein in connection with magnetic fields, it is contemplated that other physical fields may be utilized. For example, directional measurements of electrostatic fields with an electric field sensor may result in a similar electrical ellipse. Directional measurements of gravitational fields with a gravimeter may result in a similar gravitational ellipse. Directional measurements of force vector fields with an appropriate sensor may result in a similar force ellipse. Consequently, if a source of known directions is available, then one or more of the aforementioned field-based measurements of automatic calibration may be able to output directions or headings when the source of known directions or headings is unavailable.

Other methods for automatic calibration may include equivalent or trivially modified mathematics for converting the magnetic ellipse onto the unit circle; converting to another shape (e.g., square or hexagon); logical (e.g., IF-THEN statements); or storing average measured magnetic field with the corresponding headings.

A method in which digital compass accuracy may be measured can include storing differences between the valid GPS headings and the calibrated magnetometer headings for a specific number of seconds (such as 1,000 seconds); (2) if the difference between the valid GPS heading and the calibrated magnetometer heading is less than an acceptable tolerance (such as a maximum of 90° when deciding between two directions of travel [e.g., when deciding between north and south; or when deciding between east and west]), then the compass is considered accurate for that difference; (3) if the difference between the valid GPS heading and the calibrated magnetometer heading is greater than the acceptable tolerance, then the compass is considered inaccurate for that difference, (4) the number of accurate seconds per the total specific number of seconds is the percentage of compass accuracy at that time, (5) if the percentage of compass accuracy is greater than an acceptable tolerance (such as 99%), then the compass is valid for use at that time by an outside system (such as a vehicle); and (6) if the percentage of compass accuracy is less than the acceptable tolerance, then the compass is invalid for use at that time by the outside system.

The heading that is modified (e.g., calibrated) can be used to control movement of the vehicle or vehicle system. For example, the onboard computer system optionally can control a throttle, brake, and/or steering of the vehicle. The onboard computer system can change a throttle setting, engage or release the brake, and/or change a direction of movement of the vehicle using the modified heading. For example, the heading determined by the external source sensor may be calibrated and, responsive to the calibrated heading not corresponding to a desired or selected heading (e.g., determined based on a plan of a trip, operator input, or the like), the onboard computer system may automatically slow or stop movement of the vehicle system, change the direction in which the vehicle system is moving, or the like.

Figure 10:
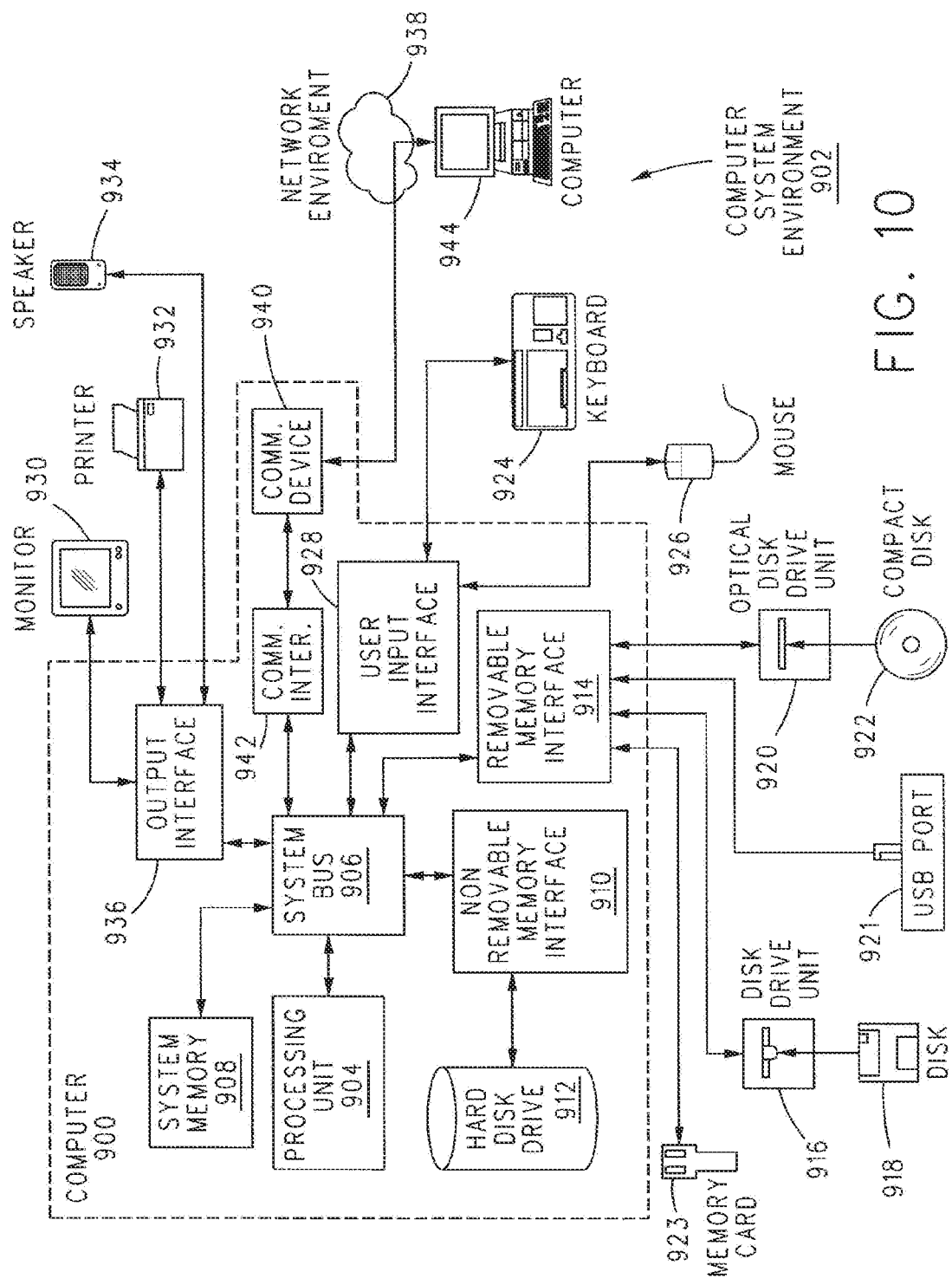
FIG. 10 illustrates a block diagram of a computer system according to one embodiment.

The inventive subject matter may be implemented on a variety of computing devices, servers, processing units, and systems, wherein these computing devices, servers, processing units, and systems include the appropriate processing mechanisms and computer-readable media for storing and executing computer-readable instructions, such as programming instructions, code, and the like. As shown in FIG. 10, computers 900, 944, in a computing system environment 902 are provided. This computing system environment 902 may include, but is not limited to, at least one computer 900 having certain components for appropriate operation, execution of code, and creation and communication of data. For example, the computer 900 includes a processing unit 904 (typically referred to as a central processing unit or CPU) that serves to execute computer-based instructions received in the appropriate data form and format. Further, this processing unit 904 may be in the form of multiple processors executing code in series, in parallel, or in any other manner for appropriate implementation of the computer-based instructions.

To facilitate appropriate data communication and processing information between the various components of the computer 900, a system bus 906 is utilized. The system bus 906 may be any of several types of bus structures, including a memory bus or memory controller, a peripheral bus, or a local bus using any of a variety of bus architectures. In particular, the system bus 906 facilitates data and information communication between the various components (whether internal or external to the computer 900) through a variety of interfaces, as discussed hereinafter.

The computer 900 may include a variety of discrete computer-readable media components. For example, this computer-readable media may include any media that can be accessed by the computer 900, such as volatile media, non-volatile media, removable media, non-removable media, etc. As a further example, this computer-readable media may include computer storage media, such as media implemented in any method or technology for storage of information, such as computer-readable instructions, data structures, program modules, or other data, random access memory (RAM), read only memory (ROM), electrically erasable programmable read only memory (EEPROM), flash memory, or other memory technology, CD-ROM, digital versatile disks (DVDs), or other optical disk storage, magnetic cassettes, magnetic tape, magnetic disk storage, or other magnetic storage devices, or any other medium which can be used to store the desired information and which can be accessed by the computer 900. Further, this computer-readable media may include communications media, such as computer-readable instructions, data structures, program modules, or other data in other transport mechanisms and include any information delivery media, wired media (such as a wired network and a direct-wired connection), and wireless media. Computer-readable media may include all machine-readable media with the possible exception of transitory, propagating signals. Of course, combinations of any of the above should also be included within the scope of computer-readable media.

The computer 900 further includes a system memory 908 with computer storage media in the form of volatile and non-volatile memory, such as ROM and RAM. A basic input/output system (BIOS) with appropriate computer-based routines assists in transferring information between components within the computer 900 and is normally stored in ROM. The RAM portion of the system memory 908 typically contains data and program modules that are immediately accessible to or presently being operated on by processing unit 904, e.g., an operating system, application programming interfaces, application programs, program modules, program data and other instruction-based computer-readable codes.

The computer 900 may also include other removable or non-removable, volatile or non-volatile computer storage media products. For example, the computer 900 may include a non-removable memory interface 910 that communicates with and controls a hard disk drive 912 (e.g., a non-removable, non-volatile magnetic medium); and a removable, non-volatile memory interface 914 that communicates with and controls a magnetic disk drive unit 916 (which reads from and writes to a removable, non-volatile magnetic disk 918), an optical disk drive unit 920 (which reads from and writes to a removable, non-volatile optical disk 922, such as a CD-ROM), a Universal Serial Bus (USB) port 921 for use in connection with a removable memory card, etc. However, it is envisioned that other removable or non-removable, volatile or non-volatile computer storage media can be used in the exemplary computing system environment 900, including, but not limited to, magnetic tape cassettes, DVDs, digital video tape, solid state RAM, solid state ROM, etc. These various removable or non-removable, volatile or non-volatile magnetic media are in communication with the processing unit 904 and other components of the computer 900 via the system bus 906. The drives and their associated computer storage media discussed above and illustrated in FIG. 8 provide storage of operating systems, computer-readable instructions, application programs, data structures, program modules, program data and other instruction-based computer-readable code for the computer 900 (whether duplicative or not of this information and data in the system memory 908).

A user may enter commands, information, and data into the computer 900 through certain attachable or operable input devices, such as a keyboard 924, a mouse 926, etc., via a user input interface 928. Of course, a variety of such input devices may be utilized, e.g., a microphone, a trackball, a joystick, a touchpad, a touch-screen, a scanner, etc., including any arrangement that facilitates the input of data, and information to the computer 900 from an outside source. As discussed, these and other input devices are often connected to the processing unit 904 through the user input interface 928 coupled to the system bus 906, but may be connected by other interface and bus structures, such as a parallel port, game port, or a universal serial bus (USB). Still further, data and information can be presented or provided to a user in an intelligible form or format through certain output devices, such as a monitor 930 (to visually display this information and data in electronic form), a printer 932 (to physically display this information and data in print form), a speaker 934 (to audibly present this information and data in audible form), etc. All of these devices are in communication with the computer 900 through an output interface 936 coupled to the system bus 906. It is envisioned that any such peripheral output devices be used to provide information and data to the user.

The computer 900 may operate in a network environment 938 through the use of a communications device 940, which is integral to the computer or remote therefrom. This communications device 940 is operable by and in communication to the other components of the computer 900 through a communications interface 942. Using such an arrangement, the computer 900 may connect with or otherwise communicate with one or more remote computers, such as a remote computer 944, which may be a personal computer, a server, a router, a network personal computer, a peer device, or other common network nodes, and typically includes many or all of the components described above in connection with the computer 900. Using appropriate communication devices 940, e.g., a modem, a network interface or adapter, etc., the computer 900 may operate within and communication through a local area network (LAN) and a wide area network (WAN), but may also include other networks such as a virtual private network (VPN), an office network, an enterprise network, an intranet, the Internet, etc. It will be appreciated that the network connections shown are exemplary and other means of establishing a communications link between the computers 900, 944 may be used.

As used herein, the computer 900 includes or is operable to execute appropriate custom-designed or conventional software to perform and implement the processing steps of the method and system of the present invention, thereby, forming a specialized and particular computing system. Accordingly, the presently-invented method and system may include one or more computers 900 or similar computing devices having a computer-readable storage medium capable of storing computer-readable program code or instructions that cause the processing unit 904 to execute, configure or otherwise implement the methods, processes, and transformational data manipulations discussed hereinafter in connection with the present invention. Still further, the computer 900 may be in the form of a personal computer, a personal digital assistant, a portable computer, a laptop, a palmtop, a mobile device, a mobile telephone, a server, or any other type of computing device having the necessary processing hardware to appropriately process data to effectively implement the presently-invented computer-implemented method and system.

The vehicle control system may utilize databases physically located on one or more computers which may or may not be the same as the respective servers. For example, programming software on computer 900 can control a database physically stored on a separate processor of the network or otherwise.

As can be seen, the system and method disclosed herein overcomes the technical problem associated with using data acquired by one or more inertial navigation sensors (e.g., magnetometers), where the accuracy of the acquired data has been adversely affected by the structure of the vehicle that houses the inertial navigation sensor(s). In an example, the structure of the vehicle can include one or more materials that are electrically and/or magnetically conductive, which material(s) can adversely affect the accuracy of the data acquired by the inertial navigation sensor(s) and, hence, the use of said data to accurately determine a heading of the vehicle.

The system and method disclosed herein for correcting the data acquired by the inertial navigation sensor(s) using GPS data overcomes this technical problem thereby enabling accurate determination of the heading of the vehicle using the corrected data.

In one embodiment, a vehicle navigation system includes an external source sensor configured to be disposed onboard a vehicle system and determine headings of the vehicle system. The external source sensor is configured to determine the headings using signals received from one or more external systems disposed off-board the vehicle system. The navigation system also includes a magnetic sensor configured to be disposed onboard the vehicle system and to measure magnetic fields along two or more different axes at different times. The navigation system also includes one or more processors configured to determine a combination of the magnetic fields that are determined at the different times, to determine one or more of a position translation or a magnitude scaling of the combination of the magnetic fields, and to modify at least one of the headings determined by the external source sensor based on the one or more of the position translation or the magnitude scaling of the combination of the magnetic fields.

Optionally, the one or more processors are configured to change movement of the vehicle system based on the at least one of the headings that is modified.

Optionally, the one or more processors also are configured to determine the headings based on a position of a reverser switch onboard the vehicle system.

Optionally, the one or more processors are configured to compare the at least one of the headings that is modified with a route layout stored in a route database to determine a calibrated heading of the vehicle system.

Optionally, the external source sensor is configured to determine the headings of the vehicle system. The magnetic sensor can be configured to measure the magnetic fields. The one or more processors can be configured to modify the at least one of the headings while the vehicle system is stationary.

Optionally, the one or more processors are configured to determine both the position translation and the magnitude scaling of the combination of the magnetic fields, and to modify the at least one of the headings based on both the position translation and the magnitude scaling of the combination of the magnetic fields.

Optionally, the one or more processors are configured to determine the position translation based on a difference between the magnetic fields measured for a current heading of the headings and the magnetic fields measured for one or more previous headings of the headings.

Optionally, the one or more processors are configured to determine the magnitude scaling based on one or more of a sine or cosine of the magnetic fields measured for a current heading of the headings divided by an average or median of the magnetic fields measured for two or more previous headings of the headings.

Optionally, the external source sensor is a global positioning system receiver.

In one embodiment, a method for determining headings of a vehicle system includes determining headings of a vehicle system using an external source sensor that receives signals from one or more external systems disposed off-board the vehicle system, measuring magnetic fields along two or more different axes at different times using a magnetic sensor disposed onboard the vehicle system, determining a combination of the magnetic fields that are determined at the different times, determining one or more of a position translation or a magnitude scaling of the combination of the magnetic fields, and modifying at least one of the headings determined by the external source sensor based on the one or more of the position translation or the magnitude scaling of the combination of the magnetic fields.

Optionally, the method also includes changing movement of the vehicle system based on the at least one of the headings that is modified.

Optionally, the headings are determined based on a position of a reverser switch onboard the vehicle system.

Optionally, the method also includes comparing the at least one of the headings that is modified with a route layout stored in a route database to determine a calibrated heading of the vehicle system.

Optionally, the headings of the vehicle system, the magnetic fields are measured, and the at least one of the headings is modified while the vehicle system is stationary.

Optionally, both the position translation and the magnitude scaling of the combination of the magnetic fields are determined, and the at least one of the headings is modified based on both the position translation and the magnitude scaling of the combination of the magnetic fields.

Optionally, the position translation is determined based on a difference between the magnetic fields measured for a current heading of the headings and the magnetic fields measured for one or more previous headings of the headings.

Optionally, the magnitude scaling is determined based on one or more of a sine or cosine of the magnetic fields measured for a current heading of the headings divided by an average or median of the magnetic fields measured for two or more previous headings of the headings.

In one embodiment, a vehicle navigation system includes a global positioning system (GPS) receiver configured to be disposed onboard a vehicle system and to determine headings of the vehicle system, a magnetic sensor configured to be disposed onboard the vehicle system and to measure magnetic fields at different times, and one or more processors configured to determine a combination of the magnetic fields that are determined at the different times, to determine a position translation and a magnitude scaling of the combination of the magnetic fields, and to modify at least one of the headings determined by the GPS receiver based on the position translation and the magnitude scaling of the combination of the magnetic fields.

Optionally, the one or more processors are configured to change movement of the vehicle system based on the at least one of the headings that is modified.

Optionally, the one or more processors are configured to compare the at least one of the headings that is modified with a route layout stored in a route database to determine a calibrated heading of the vehicle system.

Although the inventive subject matter has been described in detail for the purpose of illustration based on what is currently considered to be the most practical and preferred embodiments, it is to be understood that such detail is solely for that purpose and that the inventive subject matter is not limited to the disclosed embodiments, but, on the contrary, is intended to cover modifications and equivalent arrangements that are within the spirit and scope of the appended claims, of any. For example, it is to be understood that the inventive subject matter contemplates that, to the extent possible, one or more features of any embodiment can be combined with one or more features of any other embodiment.

What is claimed:

1. A vehicle navigation system comprising:
    an external source sensor configured to be disposed onboard a vehicle system and determine headings of the vehicle system, the external source sensor configured to determine the headings using signals received from one or more external systems disposed off-board the vehicle system;
    a magnetic sensor configured to be disposed onboard the vehicle system and to measure magnetic fields along two or more different axes at different times; and
    one or more processors configured to determine a first dimensional value of a partial ellipse along a first axis of the two or more different axes and a second dimensional value of the partial ellipse along a second axis of the two or more different axes, the first and second dimensional values determined based on the magnetic fields that are determined at the different times, the one or more processors configured to determine one or more of a position translation of the magnetic fields based on the first and second dimensional values or a magnitude scaling of the magnetic fields based on the first and second dimensional values, and to modify at least one of the headings determined by the external source sensor based on the one or more of the position translation or the magnitude scaling of the magnetic fields.

2. The vehicle navigation system of claim 1, wherein the one or more processors are configured to change movement of the vehicle system based on the at least one of the headings that is modified.

3. The vehicle navigation system of claim 1, wherein the one or more processors also are configured to determine the headings based on a position of a reverser switch onboard the vehicle system.

4. The vehicle navigation system of claim 1, wherein the one or more processors are configured to compare the at least one of the headings that is modified with a route layout stored in a route database to determine a calibrated heading of the vehicle system.

5. The vehicle navigation system of claim 1, wherein the external source sensor is configured to determine the headings of the vehicle system, the magnetic sensor is configured to measure the magnetic fields, and the one or more processors are configured to modify the at least one of the headings while the vehicle system is stationary.

6. The vehicle navigation system of claim 1, wherein the one or more processors are configured to determine both the position translation and the magnitude scaling of the magnetic fields based on the first and second dimensional values, and to modify the at least one of the headings based on both the position translation and the magnitude scaling of the magnetic fields.

7. The vehicle navigation system of claim 1, wherein the one or more processors are configured to determine the position translation based on a difference between the magnetic fields measured for a current heading of the headings and the magnetic fields measured for one or more previous headings of the headings.

8. The vehicle navigation system of claim 1, wherein the one or more processors are configured to determine the magnitude scaling based on one or more of a sine or cosine of the magnetic fields measured for a current heading of the headings divided by an average or median of the magnetic fields measured for two or more previous headings of the headings.

9. The vehicle navigation system of claim 1, wherein the first dimensional value is determined based on a difference between a first average magnetic field along a first axis of the two or more different axes measured for a current heading of the headings and a second average magnetic field along the first axis measured for one or more previous headings of the headings, and the second dimensional value is determined based on a difference between a third average magnetic field along a second axis of the two or more different axes measured for the current heading and a fourth average magnetic field along the second axis measured for the one or more previous headings.

10. A method comprising:
determining headings of a vehicle system using an external source sensor that receives signals from one or more external systems disposed off-board the vehicle system;
measuring magnetic fields along two or more different axes at different times using a magnetic sensor disposed onboard the vehicle system;
determining a first dimensional value of a partial ellipse along a first axis of the two or more different axes and a second dimensional value of the partial ellipse along a second axis of the two or more different axes, the first and second dimensional values determined based on the magnetic fields that are determined at the different times;
determining one or more of a position translation of the magnetic fields based on the first and second dimensional values or a magnitude scaling of the magnetic fields based on the first and second dimensional values; and
modifying at least one of the headings determined by the external source sensor based on the one or more of the position translation or the magnitude scaling of the magnetic fields.

11. The method of claim 10, further comprising:
changing movement of the vehicle system based on the at least one of the headings that is modified.

12. The method of claim 10, wherein the headings are determined based on a position of a reverser switch onboard the vehicle system.

13. The method of claim 10, further comprising:
comparing the at least one of the headings that is modified with a route layout stored in a route database to determine a calibrated heading of the vehicle system.

14. The method of claim 10, wherein the headings of the vehicle system, the magnetic fields are measured, and the at least one of the headings is modified while the vehicle system is stationary.

15. The method of claim 10, wherein both the position translation and the magnitude scaling of the magnetic fields are determined based on the first and second dimensional values, and the at least one of the headings is modified based on both the position translation and the magnitude scaling of the magnetic fields.

16. The method of claim 10, wherein the position translation is determined based on a difference between the magnetic fields measured for a current heading of the headings and the magnetic fields measured for one or more previous headings of the headings.

17. The method of claim 10, wherein the magnitude scaling is determined based on one or more of a sine or cosine of the magnetic fields measured for a current heading of the headings divided by an average or median of the magnetic fields measured for two or more previous headings of the headings.

18. A vehicle navigation system comprising:
a global positioning system (GPS) receiver configured to be disposed onboard a vehicle system and to determine headings of the vehicle system;
a magnetic sensor configured to be disposed onboard the vehicle system and to measure magnetic fields along multiple axes at different times; and
one or more processors configured to determine a semi-minor value of a partial ellipse along a first axis of the multiple axes and a semi-major value of the partial ellipse along a second axis of the multiple axes, the semi-minor value and the semi-major value determined based on the magnetic fields that are measured at the different times, the one or more processors configured to determine a position translation and a magnitude scaling of the magnetic fields based on the semi-minor value and the semi-major value, and to modify at least one of the headings determined by the GPS receiver based on the position translation and the magnitude scaling of the magnetic fields.

19. The vehicle navigation system of claim 18, wherein the one or more processors are configured to change movement of the vehicle system based on the at least one of the headings that is modified.

20. The vehicle navigation system of claim 18, wherein the one or more processors are configured to compare the at least one of the headings that is modified with a route layout stored in a route database to determine a calibrated heading of the vehicle system.

* * * * *